United States Patent
Grunlan et al.

(10) Patent No.: US 9,496,475 B2
(45) Date of Patent: Nov. 15, 2016

(54) HIGH PERFORMANCE THERMOELECTRIC MATERIALS

(71) Applicant: The Texas A&M University System, College Station, TX (US)

(72) Inventors: Jaime C. Grunlan, College Station, TX (US); Choongho Yu, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 14/227,956

(22) Filed: Mar. 27, 2014

(65) Prior Publication Data

US 2014/0338715 A1 Nov. 20, 2014

Related U.S. Application Data

(60) Provisional application No. 61/805,970, filed on Mar. 28, 2013.

(51) Int. Cl.
| | |
|---|---|
| H01L 35/24 | (2006.01) |
| H01L 35/22 | (2006.01) |
| H01L 35/32 | (2006.01) |
| H01L 35/34 | (2006.01) |
| B82Y 30/00 | (2011.01) |

(52) U.S. Cl.
CPC ............ *H01L 35/22* (2013.01); *H01L 35/24* (2013.01); *H01L 35/32* (2013.01); *H01L 35/34* (2013.01); *B82Y 30/00* (2013.01); *Y10S 977/742* (2013.01); *Y10S 977/948* (2013.01)

(58) Field of Classification Search
None
See application file for complete search history.

(56) References Cited

U.S. PATENT DOCUMENTS

| | | | | |
|---|---|---|---|---|
| 4,149,025 | A * | 4/1979 | Niculescu | 136/206 |
| 2004/0067530 | A1 * | 4/2004 | Gruner | G01N 33/588 435/7.1 |
| 2008/0273280 | A1 * | 11/2008 | Chen | B82Y 10/00 361/56 |
| 2009/0022650 | A1 * | 1/2009 | Choi et al. | 423/445 B |
| 2009/0044848 | A1 * | 2/2009 | Lashmore et al. | 136/201 |
| 2012/0312343 | A1 * | 12/2012 | VanVechten et al. | 136/201 |
| 2013/0312806 | A1 * | 11/2013 | Carroll | 136/212 |

FOREIGN PATENT DOCUMENTS

WO   WO 2012054504 A2 *   4/2012

OTHER PUBLICATIONS

Yu, et al., "Air-stable fabric thermoelectric modules made of N- and P-type carbon nanotubes," Energy Environ. Sci., 2012, vol. 5, pp. 9481-9486.*
Yu, et al., "Modulating Electronic Transport Properties of Carbon Nanotubes to Improve the Thermoelectric Power Factor via Nanoparticle Decoration," ACS Nano, 2011, vol. 5, pp. 1297-1303.*
Moriarty, Gregory, "Tailoring the Thermoelectric Behavior of Electrically Conductive Polymer Composites" (Doctoral dissertation, Aug. 2013).*
Moriarty, et al., "Increasing the thermoelectric power factor of polymer composites using a semiconducting stabilizer for carbon nanotubes", Carbon, vol. 50 (Oct. 2, 2011), pp. 885-895.*

(Continued)

*Primary Examiner* — Allison Bourke
*Assistant Examiner* — William E McClain
(74) *Attorney, Agent, or Firm* — Tumey L.L.P.

(57) ABSTRACT

A method and device produce thermoelectric power and thermoelectric modules. In one embodiment, a thermoelectric module comprises N-type carbon nanotube film and P-type carbon nanotube film.

12 Claims, 12 Drawing Sheets

(56) References Cited

OTHER PUBLICATIONS

Moriarty, et al., "Fully Organic Nanocomposites with High Thermoelectric Power Factors by using a Dual-Stabilizer Preparation", Energy Technology, vol. 1 (Apr. 5, 2013), pp. 265-272.*

Rastogi, et al., "Comparative Study of Carbon Nanotube Dispersion Using Surfactants", Journal of Colloid and Interface Science, vol. 328 (2008), pp. 421-428.*

Xiang, et al., "Synthesis and Electrochemical Performance of Nitrogen-Doped Carbon Nanotubes", Acta Phys. -Chim. Sin., 27 (2011), 443-448.*

Machine translation of Xiang, et al.*

Yu, et al., "Light-Weight Flexible Carbon Nanotube Based Organic Composites with Large Thermoelectric Power Factors", ACS Nano, 5 (2011), 7885-7892.*

Kim, et al., "Improved Thermoelectric Behavior of Nanotube-Filled Polymer Composites with Poly(3,4-ethylenedioxythiophene) Poly(styrenesulfonate)", ACS Nano, 4 (2010), 513-523.*

Chun, et al., "Highly conductive, printable and stretchable composite films of carbon nanotubes and silver", Nature Nanotechnology, 5 (2010), 853-857.*

Kim, et al. "Flexible power fabrics made of carbon nanotubes for harvesting thermoelectricity." ACS nano 8.3 (2014): 2377-2386.*

* cited by examiner

| TABLE 1. THERMOELECTRIC POLYMER NANOCOMPOSITE RECIPES ||||| 
|---|---|---|---|---|
| SAMPLE NAME | CNT CONC. (wt%) | CNT TYPE | CNT (PEDOT:PSS) TCPP RATIO | DRYING TEMP. |
| A1 | 10 | MWNT | 1:1:0.25 | ROOM TEMP (RT) |
| A2 | 20 | MWNT | 1:1:0.25 | RT |
| A3 | 30 | MWNT | 1:1:0.25 | RT |
| A4 | 40 | MWNT | 1:1:0.25 | RT |
| B1 | 10 | MWNT | 1:2:0.25 | RT |
| B2 | 20 | MWNT | 1:2:0.25 | RT |
| B3 | 30 | MWNT | 1:2:0.25 | RT |
| C1 | 10 | MWNT | 1:3:0.25 | RT |
| C2 | 20 | MWNT | 1:3:0.25 | RT |
| D1 | 10 | MWNT | 1:4:0.25 | RT |
| E1 | 10 | MWNT | 1:1:0.25 | RT +80°C |
| E2 | 20 | MWNT | 1:1:0.25 | RT +80°C |
| E3 | 30 | MWNT | 1:1:0.25 | RT +80°C |
| E4 | 40 | MWNT | 1:1:0.25 | RT +80°C |
| F1 | 10 | MWNT | 1:1:0.25 | RT +80°C |
| F2 | 20 | DWNT | 1:1:0.25 | RT +80°C |
| F3 | 30 | DWNT | 1:1:0.25 | RT +80°C |
| F4 | 40 | DWNT | 1:1:0.25 | RT +80°C |

*FIG. 7*

FIG. 8A 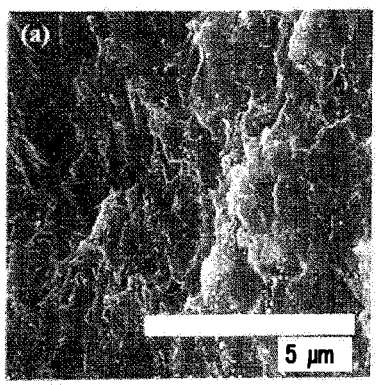 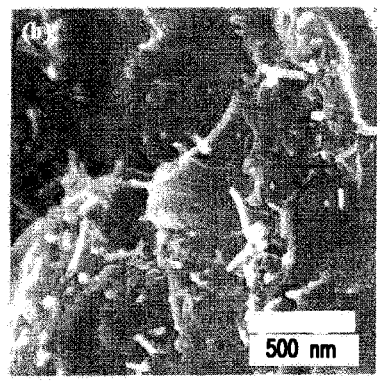 FIG. 8B
FIG. 8C 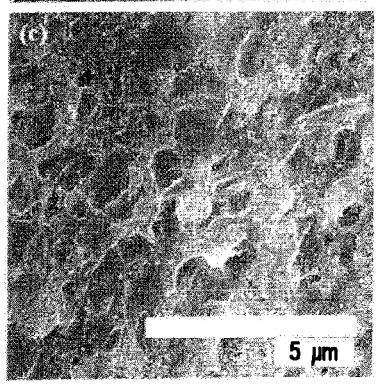 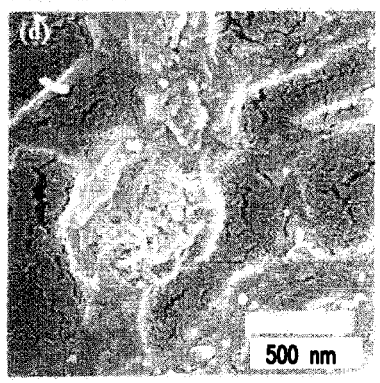 FIG. 8D
FIG. 8E 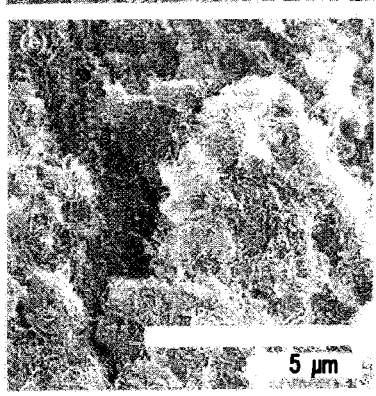 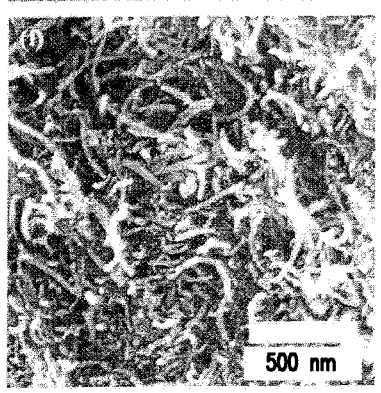 FIG. 8F FIG. 9A 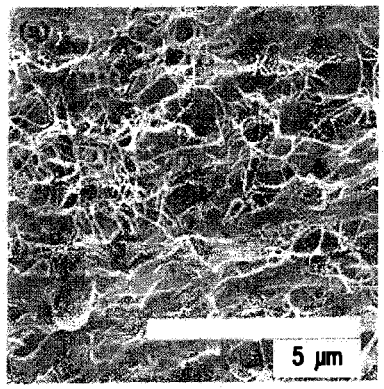 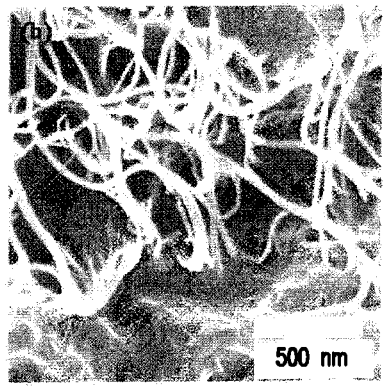 FIG. 9B
FIG. 9C 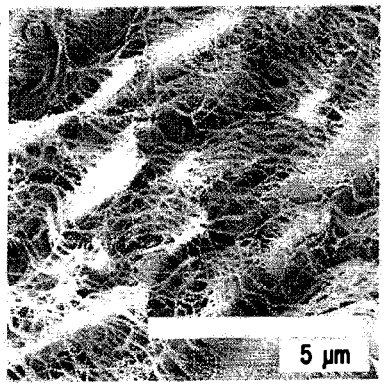 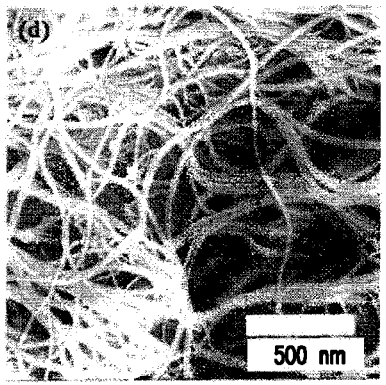 FIG. 9D

HIGH PERFORMANCE THERMOELECTRIC MATERIALS

CROSS-REFERENCE TO RELATED APPLICATIONS

This application claims priority to U.S. Provisional Patent Application No. 61/805,970, filed on Mar. 28, 2013, titled "High Performance Thermoelectric Materials" which is incorporated by reference herein in its entirety.

STATEMENT REGARDING FEDERALLY SPONSORED RESEARCH OR DEVELOPMENT

Not applicable.

BACKGROUND OF THE APPLICATION

1. Field of the Application

This application relates to the field of thermoelectric materials and more specifically to the field of thermoelectric nanocomposites.

2. Background of the Application

As the world's supply of fossil fuels continues to diminish, energy recovered from heat dissipated into the environment offers an abundant alternative fuel source. Temperature gradients are commonly produced by the environment (e.g., geothermal energy) or may be man-made by the countless systems that consume power (e.g., combustion engines, home appliances, etc.). These gradients are generally too small for conventional systems to adequately harvest energy from, but thermoelectric materials may have the ability to convert any temperature gradient into useful electricity. In order to harness this energy, an electrical current is created from the waste heat by the diffusion of charge carriers (i.e., electrons or holes) through the material from the hot side to the cold, or vice versa (i.e., the Seebeck effect). Traditional inorganic thermoelectric devices have garnered tremendous amounts of research due to their simple leg-type structure, high power density, and lack of noise pollution. However, only moderate improvements in conversion efficiency have resulted from this research. Typically, the resultant inorganic alloys contain heavy and expensive elements that require high processing temperatures and suffer from poor mechanical properties and toxicity issues. These issues have hindered the widespread use of the inorganic thermoelectric devices thus far.

Fully-organic, electrically conductive composites may provide an environmentally friendly, light-weight alternative to the traditional inorganic thermoelectric devices. Polymer-based materials are of interest because of their intrinsically low thermal conductivity associated with their composite matrix ($\leq 0.2$ W/(m·K)). Low thermal conductivity and high electrical conductivity are the ideal properties for efficient thermoelectric conversion as defined by the thermoelectric figure of merit (i.e. the dimensionless parameter "ZT") which may be calculated by the following equation:

$$ZT = (S^2 \sigma T)/k \quad \text{(Eq. 1)}$$

where S, $\sigma$, k, and T are the Seebeck coefficient (or thermopower), electrical conductivity, thermal conductivity, and absolute temperature, respectively. The power factor (i.e. $S^2\sigma$) is of primary concern when seeking to measure conversion efficiency in relation to lowering thermal conductivity. Typical semiconducting alloys have been shown to achieve power factors greater than about 2,500 μW/(m·K2), which is a ZT of about 1, at room temperature. For comparison, a thermoelectric material having a ZT of 4 may be equivalent to the efficiency of a home refrigerator.

Polymer nanocomposites, composed of carbon nanotubes ("CNT") in a poly(vinyl acetate) latex may provide a suitable alternative to the traditional inorganic thermoelectric devices. As such, polymer nanocomposites have been developed that may have low densities, may not require complex manufacturing processes, and may have desirable mechanical properties (e.g., flexibility). Additionally, using a polymer emulsion (or latex) as the composite matrix may allow for conductive composites to be prepared from water under ambient conditions. An example emulsion may exist as an aqueous suspension of solid polymer particles with diameters between about 0.1 μm to about 1 μm. The larger polymer particles in the emulsion may exclude volume and force the smaller CNTs into the interstitial spaces that exist in-between the larger polymer particles. This excluded volume effect may be responsible for increasing the electrical conductivity of the network. This increase in electrical conductivity may be apparent even in polymer nanocomposites comprising small amounts of filler. Utilizing this segregated network approach, the electrical conductivity values of the polymer nanocomposites may be brought into the range of degenerate-semiconductor or metallic regimes.

For typical monolithic and inorganic semiconductors, increasing the electrical conductivity and/or the thermal conductivity may result in a decrease in the Seebeck coefficient. To decouple the Seebeck coefficient from the thermoelectric properties, water-based composites containing electrically connected, but thermally disconnected junctions may be used to create a small energy barrier for electron transport. This small energy barrier may deter low energy electron transport. In addition, this barrier may make it possible to increase electrical conductivity without decreasing the Seebeck coefficient. Additionally, the small energy barrier may be altered by the use of stabilizers needed to completely exfoliate the hydrophobic CNTs in water. The CNTs naturally form bundles due to Van der Waals forces between them. Varying the stabilizing agents may affect the electron transport across the CNT junctions. Surfactants, polymers, and inorganic nanoparticles have all been successfully used to exfoliate CNTs. It has been recently shown that intrinsically conductive polymer stabilizers, such as poly(3,4-ethylenedioxythiophene)poly(styrenesulfonate) ("PEDOT:PSS"), may dramatically increase composite electrical conductivity. It has also been shown that CNT stabilizing, semiconducting molecules such as meso-tetra(4-carboxyphenyl) porphine ("TCPP"), may increase the Seebeck coefficient of these segregated network composites. Therefore, using a combination of multiple stabilizers to exfoliate carbon nanotubes may have the potential to simultaneously increase electrical conductivity, the Seebeck coefficient, and the power factor.

Consequently, there is a need for improved nanocomposite thermoelectric materials. Further needs include improved methods for making nanocomposite thermoelectric materials.

BRIEF SUMMARY OF SOME OF THE PREFERRED EMBODIMENTS

These and other needs in the art are addressed in one embodiment by a thermoelectric module. The module comprises N-type carbon nanotube film and P-type carbon nanotube film.

The foregoing has outlined rather broadly the features and technical advantages of the present application in order that the detailed description of the application that follows may be better understood. Additional features and advantages of the application will be described hereinafter that form the subject of the claims of the application. It should be appreciated by those skilled in the art that the conception and the specific embodiments disclosed may be readily utilized as a basis for modifying or designing other embodiments for carrying out the same purposes of the present application. It should also be realized by those skilled in the art that such equivalent embodiments do not depart from the spirit and scope of the application as set forth in the appended claims.

BRIEF DESCRIPTION OF THE DRAWINGS

For a detailed description of the embodiments, reference will now be made to the accompanying drawings in which:

FIG. 6(a) illustrates an embodiment of carbon nanotubes decorated by PEDOT:PSS and TCPP molecules and the junction between;

FIG. 7 illustrates a table showing embodiments of recipes for thermoelectric polymer nanocomposites;

FIGS. 8(a), (b) illustrate a SEM cross-section image of a composite containing 10 wt. % MWNT at 1:1:0.25 MWNT:(PEDOT:PSS):TCPP;

FIGS. 8(c), (d) illustrate a SEM cross-section image of a composite containing 10 wt. % MWNT at 1:4:0.25 MWNT:(PEDOT:PSS):TCPP;

FIGS. 8(e), (f) illustrate a SEM cross-section image of a composite containing 40 wt. % MWNT at 1:1:0.25 MWNT:(PEDOT:PSS):TCPP;

FIGS. 9(a), (b) illustrate a SEM cross-sectional image of 1:1:0.25 DWNT:(PEDOT:PSS):TCPP composite having 10 wt. % DWNT;

FIGS. 9(c), (d) illustrate a SEM cross-sectional image of 1:1:0.25 DWNT:(PEDOT:PSS):TCPP composite having 40 wt. % DWNT;

DETAILED DESCRIPTION OF THE PREFERRED EMBODIMENTS

Embodiments of a thermoelectric module comprise carbon nanotubes. Any type of carbon nanotube may be sufficient for use, including single-walled CNTs ("SWNT"), double-walled CNTs ("DWNT"), multi-walled CNTs ("MWNT"), the like, or any combinations thereof. CNTs produced by any suitable method may be used in embodiments, for example, CNTs produced via chemical vapor deposition. Additionally, the CNTs may have any diameter and length sufficient for embodiments of the thermoelectric module.

Figure 1:
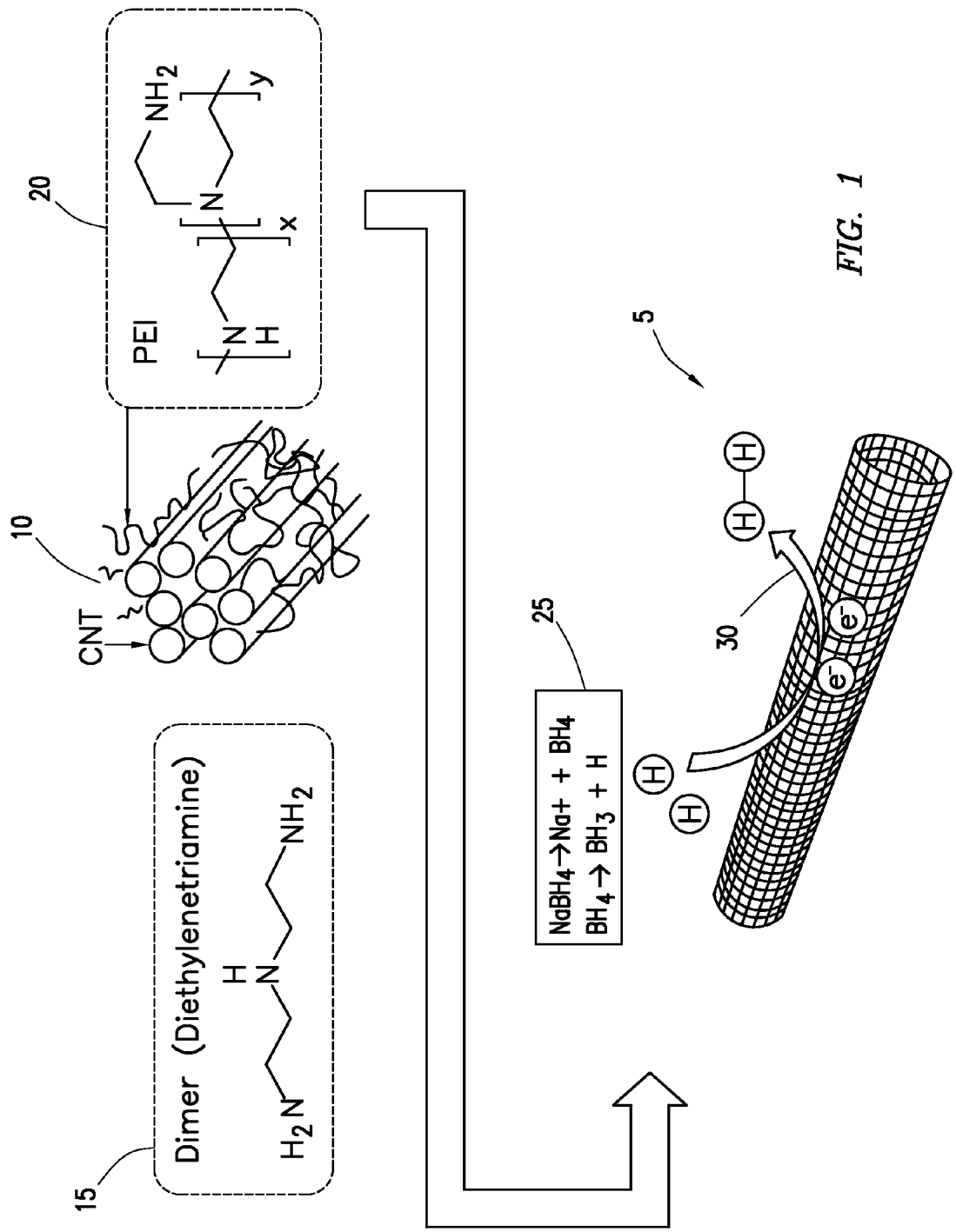
FIG. 1 illustrates an embodiment of synthesis of N-type film.

FIG. 1 illustrates an embodiment of the synthesis of N-type CNT film 5. Generally, this embodiment comprises reduction of ethyleneamine and/or ethyleneimine-wrapped carbon nanotubes by using a sodium borohydride ($NaBH_4$) treatment. In the embodiment of FIG. 1, the CNT 10 is functionalized with both diethylenetriamine 15 ("DETA") and polyethyleneimine 20 ("PEI"). In embodiments, functionalization may be accomplished by any ethyleneamine, ethyleneimine, the like, or any combination thereof. In this embodiment, the last stage of the fabrication includes dipping the carbon nanotube 10 in a $NaBH_4$ treatment 25. Without limitation, the $NaBH_4$ 25 treatment increases the electrical conductivity of the material (e.g., by improving N-type performance by reducing the CNTs 10 with $NaBH_4$, such that the amount of electrons available for conduction is increased, as illustrated by arrow 30). Although the exemplary embodiment utilizes a $NaBH_4$ treatment 25 as the reducing agent, embodiments encompass and envision any sufficient reducing agent capable of reducing the CNTs 10 such that the amount of electrons available for conduction is increased. Additionally, any ethyleneamine and/or ethylenimine may be used to functionalize the CNTs 10. In embodiments, synthesis of the N-type CNT film 5 comprises a water-based method of assembly, wherein the N-type CNT film 5 is synthesized in water. For example, the synthesis components may be dispersed in water and sonicated to create a homogenous mixture. This method of synthesis may also comprise binders (e.g., a latex), stabilizers, the like, or any combination thereof.

Figure 2:
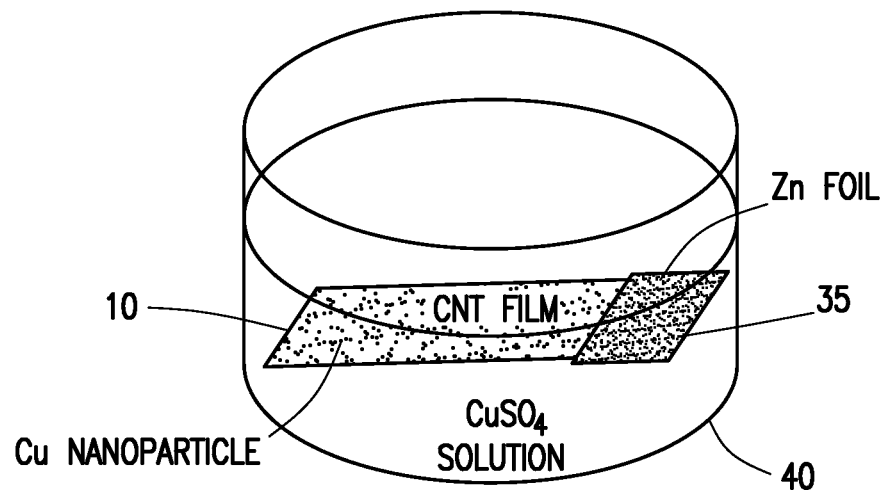
FIG. 2 illustrates an embodiment of synthesis of P-type film.

FIG. 2 illustrates an embodiment of the synthesis of P-type CNT film 35. In embodiments, P-type performance may be improved by the decoration of nanoparticles on a film comprising CNTs 10. Some embodiments may comprise nanoparticle decoration via galvanic displacement, spontaneous reduction, or any other suitable method. In the embodiment of FIG. 2, a CNT film is dipped in a $CuSO_4$ solution 40. In the embodiment of FIG. 2, the copper particles precipitate and may become decorated on the CNT film, thus generating P-type CNT film 35 (e.g., by improving P-type performance through decoration of nanoparticles, such that the amount of electrons available for conduction is decreased.) Any nanoparticle may be used to decorate a CNT film. Examples include copper, gold, platinum, silver, the like, or any combinations thereof. In embodiments, the synthesis of the P-type CNT film 35 comprises a water-based method of assembly, wherein the P-type CNT film 35 is synthesized in water. For example, the synthesis components may be dispersed in water and sonicated to create a homogenous mixture. This method of synthesis may also comprise binders (e.g., latex), stabilizers, the like, or any combination thereof.

In alternative embodiments, both N-type CNT film 5 and P-type CNT film 35 may be synthesized and/or functionalized using one or more stabilizers (e.g., sodium dodecylbenzenesulfonate ("SDBS"), TCPP, PEDOT:PSS, the like, or any combinations thereof). Any suitable electrically conducting, semiconducting, and/or insulating stabilizer may be used to synthesize a film comprising CNTs 10. The stabilizer may disaggregate and disperse CNTs 10 in addition to functionalizing the CNTs 10 in the solution. In embodiments comprising CNT film synthesis using a stabilizer, the stabilizer may be added to a CNT 10 solution in about a 1:1 to about a 5:1 weight ratio. As an example, SDBS may be added to a CNT 10 solution in a weight ratio of about 3 units of SDBS per 1 unit of CNT 10. In embodiments, this synthesis method of the CNT film comprises a water-based method of assembly, wherein the CNT film is synthesized in water. For example, the synthesis components may be dispersed in water and sonicated to create a homogenous mixture. This method of synthesis may also comprise binders (e.g., a latex), additional stabilizers, the like, or any combination thereof.

Figure 3:
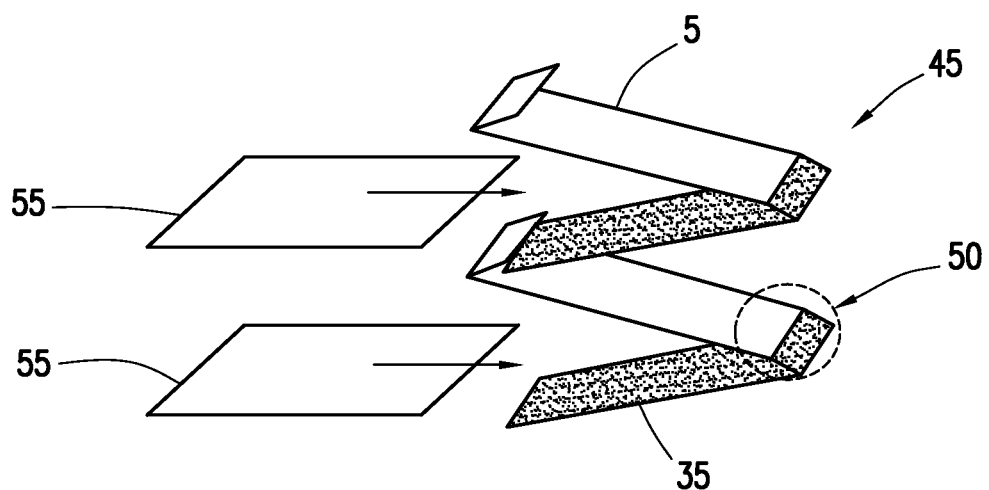
FIG. 3 illustrates an embodiment of fabricating a thermoelectric module having N-type and P-type carbon nanotubes with a stacking method.
Figure 4:
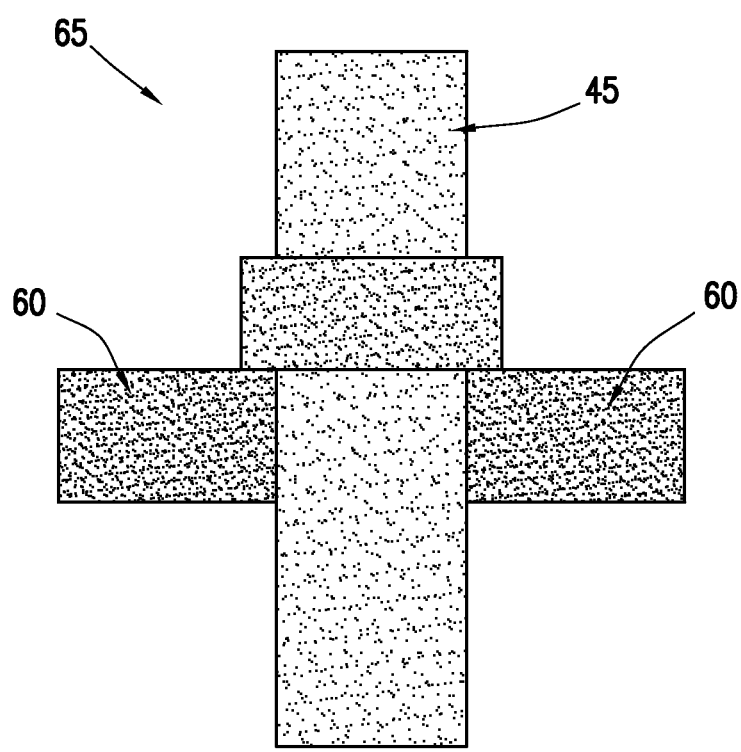
FIG. 4 illustrates an embodiment of a thermoelectric module having stacked N-type and P-type carbon nanotubes.

FIG. 3 illustrates an embodiment of a method for assembling a thermoelectric module 45, and FIG. 4 illustrates an embodiment of the assembled thermoelectric module 45. In embodiments, the method includes assembling N-type CNT film 5 and P-type CNT film 35 (i.e., legs). In embodiments, the method comprises a stacking method for assembling the N-type CNT film 5 and P-type CNT film 35 to fabricate the thermoelectric module 45. In an embodiment, the method includes securing each CNT film to another CNT film, end to end as shown in FIG. 3. Any suitable securing means 50 may be used to secure the films. In embodiments, the securing means 50 may comprise any suitable adhesive (e.g., a glue). In the embodiment of FIG. 3, the glue may be a conductive glue. In some embodiments, the securing means 50 may comprise silver (i.e., a silver paste) and a carbon-based filler. In embodiments, any suitable carbon-based filler may be used, for example, carbon black, graphite, carbon nanotubes, graphene, the like, or any combinations thereof. In embodiments as shown, the thermoelectric module 45 comprises alternating N-type CNT films 5 and P-type CNT films 35. It is to be understood that the thermoelectric module 45 is not limited to alternating N-type CNT films 5 and P-type CNT films 35 but may comprise any combination of N-type CNT films 5 and P-type CNT films 35. In the embodiment of FIG. 3, the N-type CNT film 5 and P-type CNT film 35 are connected in series. In embodiments, the method includes adding electrical insulation 55. In some embodiments, the thermoelectric module 45 comprises electrical insulation 55 between at least two films. In an embodiment, the thermoelectric module 45 comprises electrical insulation 55 between each two connected films as illustrated in FIG. 3. The electrical insulation 55 may be any suitable electrical insulation. In embodiments, electrical insulation 55 may be polytetrafluroethylene ("PTFE") film. In embodiments, the electrical insulation 55 may be secured by any securing means 50, including the identical securing means 50 used to secure a CNT film to another CNT film (e.g., glue). The thermoelectric module 45 may comprise any number of CNT films. In an embodiment, the thermoelectric module 45 has alternating P-type CNT films 35 and N-type CNT films 5 and comprises one hundred P-type CNT films 35 and one hundred N-type CNT films 5. FIG. 4 illustrates an embodiment comprising a fully stacked thermoelectric module 45 attached to electrical leads 60 and disposed upon a laminating sheet 65.

FIGS. 5(*a*) and 5(*b*) illustrate an embodiment of a method for assembling a thermoelectric module 45. FIG. 5(*a*) shows a top view of thermoelectric module 45, and FIG. 5(*b*) shows a perspective view of a section of thermoelectric module 45. $T_L$ represents temperature low side, and $T_H$ represents temperature hot side. In this embodiment, the method includes attaching stacked CNT films 70 to each other to assemble thermoelectric module 45. In the embodiment as shown, the stacked CNT films 70 comprise any suitable number of N-type CNT films 5 and P-type CNT films 35. Thermoelectric module 45 may comprise stacked CNT films 70 stacked horizontally and vertically (i.e., in series and parallel). In embodiments, the stacked CNT films 70 are attached to each other by electrical insulation 55. In embodiments, the stacked CNT films 70 may comprise the N-type CNT films 5 and P-type CNT films 35 in an alternating configuration. In an embodiment, thermoelectric module 45 comprises ten stacked CNT films 70. In another embodiment, thermoelectric module 45 may comprise ten N-type CNT films 5 and ten P-type CNT films 35 in an alternating configuration. In some embodiments, the thermoelectric module 45 and the method for assembling the thermoelectric module 45 may comprise a schematic of a fifty set stacked CNT film 70. In embodiments, a method of placing stacked CNT films 70 at both sides may double the output voltage and power of the thermoelectric module 45. Without limitation, the stacking method may allow the building of small-sized stacked CNT films 70 without a loss of voltage or power. Without limitation, thermoelectric module 45 may be paintable, sprayable, and flexible.

In embodiments, conductive, semiconductive, and insulating stabilizers may be used individually or in combination to produce the N-type CNT films 5 and P-type CNT films 35. In embodiments, the stabilizers may be used to disaggregate and/or disperse the CNTs such that the CNTs are made soluble in a water solution. In embodiments, the stabilizers may be added to the water solution when the CNTs are to be synthesized such that the stabilizers may disaggregate and/or disperse the CNTs in the solution. Additionally, as discussed above, in some embodiments, the stabilizers may be used to functionalize a CNT film. Further, in some embodiments, the stabilizers may be used to synthesize CNT films with increased Seebeck coefficients and/or electrical conductivity. Examples of stabilizers include TCPP, PEDOT:PSS, SCBS, the like, or any combinations thereof. Without limitation, because of the coupled nature of the Seebeck coefficient and electrical conductivity, the two typically exist in an inverse relationship unless they are decoupled. Therefore, some embodiments comprise mixing an electrically conducting stabilizer with a semiconducting stabilizer or insulating stabilizer. For example, PEDOT:PSS is an electrically conducting stabilizer and may be mixed with the semiconducting stabilizer TCPP. In embodiments comprising the mixing of stabilizers, the stabilizers may be mixed to optimize the power factor (i.e. $S^2\sigma$ of Eq. 1). In embodiments, the stabilizers may be mixed in any ratio. For example, a ratio of conducting stabilizer to semiconducting or insulating stabilizer may range from about 0.5:0.01 to about 5:1, alternatively from about 1:0.25, and further alternatively from about 2:0.25.

In embodiments, a binder may be used in the synthesis of the N-type CNT films 5 and the P-type CNT films 35. Any suitable binder may be used. Examples of binders include both natural and synthetic latexes. An example of a suitable binder is polyvinyl acetate) latex.

In an embodiment, N-type CNT film 5 was prepared using a MWNT stabilized by a combination of TCPP and PEDOT:PSS. In the embodiment, the electrical conductivity ($\sigma$) of the MWNT stabilized by a dual-stabilizer combination of TCPP and PEDOT:PSS was increased to ~9,500 S/m as both the multi-walled carbon nanotube (MWNT) and PEDOT:PSS concentrations increased. The thermopower (or Seebeck coefficient (S)) and thermal conductivity, however, remained relatively unaffected ((~40 $\mu$V/K and ~0.12 W/(m·K) respectively) with this increase. In an alternative embodiment, the MWNT was replaced with 40 wt. % DWNT. In this embodiment, $\sigma$ increased to ~96,000 S/m and S increased to ~70 $\mu$V/K. From these embodiments, it may be concluded that both $\sigma$ and S may be simultaneously tailored by using multiple stabilizing agents to affect the transport properties across the junctions between nanotubes. Without limitation, this tailoring may be accomplished by combining conductive, semiconductive, and/or insulating CNT stabilizers. In some embodiments, CNTs stabilized in this manner may lead to a power factor that is among the best for a completely organic, free-standing film ~500 $\mu$W/(m·K2). As such, these flexible segregated network nanocomposites may achieve properties that surpass, without limitation, typical inorganic semiconductors, especially when normalized by density.

In embodiments, carbon nanotubes prepared with a conductive stabilizer (e.g., PEDOT:PSS) and a semiconducting stabilizer (e.g., TCPP) simultaneously increased the electrical conductivity and Seebeck coefficient. Additionally, PEDOT:PSS may effectively stabilize and disperse CNTs in water, which, without limitation, may enhance the electrical conductivity of the network and prevent CNT aggregation. Without limitation, TCPP also may stabilize nanotubes due to its conjugated chemistry that promotes $\pi$-$\pi$ stacking and increases the Seebeck coefficient of organic composites. In an embodiment, a composite comprising poly(vinyl acetate) latex and 40 wt. % MWNT in a 1:1:0.25 weight ratio with PEDOT:PSS and TCPP respectively, exhibited an electrical conductivity of ~9,500 S/m. Substituting DWNT for MWNT in the same composite system, increased conductivity by a full order of magnitude (~96,000 S/m) and nearly doubled the Seebeck coefficient (~70 $\mu$V/K). In this embodiment, the electrical conductivity may be comparable to composites of SWNT stabilized with PEDOT:PSS, while S may be comparable to the high values associated with DWNT stabilized with TCPP. These thermoelectric properties may be greater than those of typical polymer composites containing CNTs and may also be among the highest power factors (S2$\sigma$) reported for a completely organic material (~500 $\mu$W/(m·K2)). In embodiments, using a dual-stabilizer system may simultaneously enhance the thermoelectric properties of polymer nanocomposites and provide a way to create high efficiency organic materials for harvesting waste heat from previously inconceivable places (e.g., fibers in clothing that convert body heat to a voltage that could recharge a cell phone).

Embodiments also include polymeric thermoelectric materials containing segregated nanoparticle networks as disclosed in U.S. patent application Ser. No. 61/253,992 filed on Oct. 22, 2009, which is incorporated by reference herein in its entirety.

EXAMPLES

To further illustrate various illustrative embodiments, the following examples are provided.

Example 1

Materials included a vinyl acetate polymer (PVAc) emulsion (VINNAPAS® 401, which is a registered trademark of Wacker Chemie AG stock corporation, Hanns-Seidel-Platz 4 Munich, Germany, 81737), that was 55 wt. % solids in water with an average particle size of ~650 nm, which was used as the composite matrix material. Multi-walled carbon nanotubes (BAYTUBES® C 150P, which is a registered trademark of Bayer Aktiengesellschaft, Joint Stock Company, Germany, Kaiser-Wilhelm-Alee 51373 Leverkusen, Germany), with an average diameter of 14 nm and a length of 1-10 $\mu$m, were used as an electrically conductive filler. Double-walled carbon nanotubes (DWNT) (XBC 1001 provided by Continental Carbon Nanotechnologies, Inc., Houston, Tex.), with an average outer diameter of 3 nm and length of 0.5-2.0 $\mu$m, were used as a higher conductivity filler. PEDOT:PSS (CLEVIOS® PH1000, which is a registered trademark of Heraeus Precious Metals GMBH & Co., Heraeusstr, 12-14 Hanau, Germany 63450), doped with dimethyl sulfoxide (DMSO), and TCPP (Frontier Scientific, Logan, Utah) were used to stabilize the CNT in water during the composite preparation.

CNTs stabilized with PEDOT:PSS and TCPP were prepared in four weight ratios of 1:1:0.25, 1:2:0.25, 1:3:0.25, and 1:4:0.25 (i.e. CNT:(PEDOT:PSS):TCPP) using aqueous solutions of 1.23 wt. % PEDOT:PSS and 2.67 wt. % TCPP, respectively. The aqueous suspensions were then sonicated with a VIRTIS® Virsonic 100 ultrasonic cell disrupter (which is a registered trademark of SP Industries Inc., Warminster, Pa.) for 15 minutes at 50 W in a water bath. All solutions were left at their unaltered pH values. The polymer emulsion and deionized water were then added to the CNT:(PEDOT:PSS):TCPP mixture and sonicated again for another 5 minutes at 50 W. This final aqueous suspension contained 5 wt. % total solids. Composites with four different CNT concentrations (10, 20, 30, and 40 wt. %) were prepared by drying suspensions in a 26 cm$^2$ plastic mold for 2 days under ambient conditions and then for 24 hours in a vacuum desiccator. This was done to ensure that all residual moisture was removed prior to testing. Composites containing 10, 20, 30, and 40 wt. % CNT stabilized at a 1:1:0.25 CNT:(PEDOT:PSS):TCPP weight ratio, were prepared in the same manner, but dried in a vented hood for 36 hours and then in an oven at 80° C. for 6 hours. These final aqueous suspensions contained 1.5 wt. % total solids. Concentrations were based upon the dry weight of PVAc, CNT, and stabilizer solids used in the composite.

The in-plane electrical conductivity and Seebeck coefficients were measured with a home-built, shielded four-point probe apparatus, equipped with a KEITHLEY® 2000 Multimeter (which is a registered trademark of Keithley Instruments, Inc., Aurora Road, Cleveland, Ohio 44139) and a GW PPS-3635 power supply (Good Will Instrument Co., LTD) and operated with a Labview (National Instruments, Austin, Tex.) interface. Samples were cut into a rectangular shape, ~20 mm in length and 3 mm in width. The electron micrographs of composite cross-sections were taken with a JEOL JSM-7500F FE-SEM. Samples were soaked in liquid nitrogen and freeze fractured by hand, then sputter coated with 5 nm of platinum prior to imaging. During imaging, the accelerating voltage was 10 kV, with a spot size of 3.0 nm and a working distance of approximately 10 nm. Through-thickness thermal conductivity was measured with a home-made ASTM D5470 standard setup.

Figure 6C:
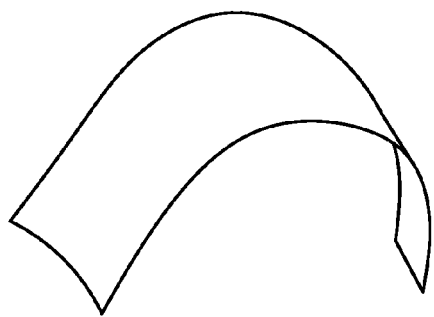
FIG. 6(c) illustrates an embodiment of a dried, free standing, flexible composite.
Figure 6A:
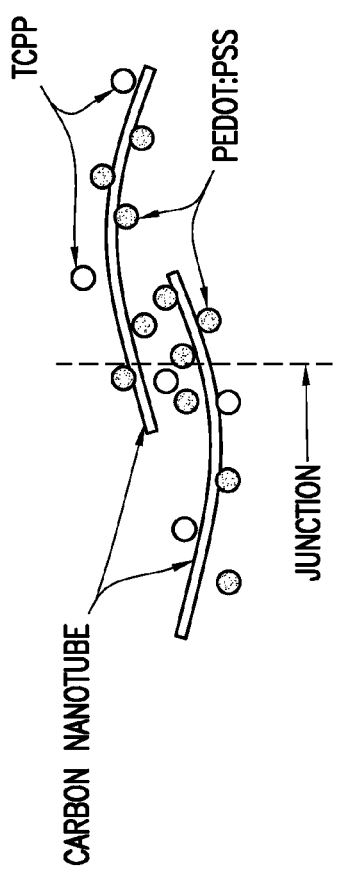
Figure 6B:
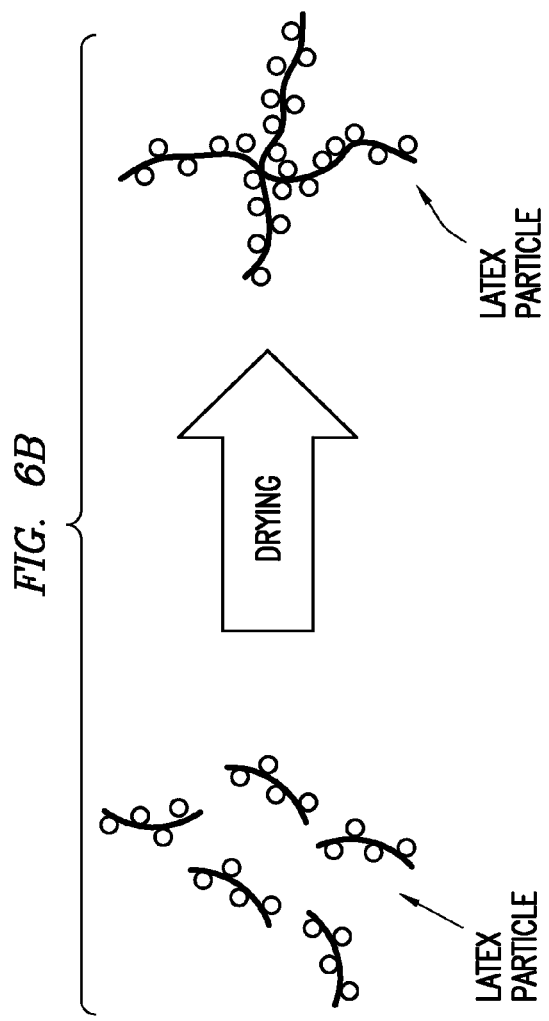
FIG. 6(b) illustrates an embodiment of the formation of a segregated network composite during polymer coalescence during drying.

FIG. 6(a) schematically shows PEDOT:PSS and TCPP exfoliating carbon nanotubes in aqueous solution through π-π stacking interactions on the nanotube surface, changing them from hydrophobic to hydrophilic. It is believed that the increased electrical conductivity of PEDOT:PSS-stabilized CNTs is due to the more favorable junctions between them, which is dominated by the conductive stabilizer (as illustrated in FIG. 6(a)). Without limitation, it is also believed that the addition of TCPP at the junction increases the Seebeck coefficient by creating a larger energy barrier for low energy electrons than the previous single-stabilizer composites. During the drying of the stabilized nanotube and latex suspension, the polymer particles excluded volume and forced the CNT into the spaces between them, as shown schematically in FIG. 6(b). As the water evaporated, the polymer particles coalesced together to create an electrically connected, but thermally disconnected, three-dimensional network of nanotubes in a flexible composite (FIG. 6(c)). The table of FIG. 7 summarizes the six different sets (A-F) of polymer composites examined.

In the first set of composites (A1-A4), four different MWNT concentrations, with a fixed 1:1:0.25 MWNT:(PEDOT:PSS):TCPP weight ratio, were used to show the influence of filler concentration on thermoelectric properties. Subsequent composite sets (B-D) were fabricated to compare the thermoelectric properties of the composites made with different amounts of PEDOT:PSS in relation to MWNT and TCPP. PEDOT:PSS concentration may affect the CNT dispersion and transport behavior at tube junctions. For the two remaining sets of samples (E-F), a mixed drying condition that involved drying in a vented hood for thirty-six hours and then in an oven at 80° C. for six hours, was used. The elevated temperature removed excess dopant (DMSO) and helped strengthen the segregated network.

FIGS. 8(a)-(f) show scanning electron micrographs of freeze fractured composite cross-sections with different MWNT concentrations and MWNT:(PEDOT:PSS):TCPP weight ratios (Samples A1, A4, and D1). MWNTs are shown as light-colored spaghetti-like flexible cylinders in these images. FIGS. 8(a) and (b) (Sample A1) clearly show the segregated network behavior previously described, with the MWNT forced into the interstitial spaces between the non-conductive, coalesced polymer particles (dark regions). As the MWNT:(PEDOT:PSS):TCPP ratio was increased to 1:4:0.25 (FIG. 8(c), Sample D1), the MWNT appears better stabilized due to its more homogeneous dispersion throughout the composite cross section. At higher magnification (FIG. 8(d)), the junctions between the MWNTs become more visible, but may still be somewhat obscured by their clustering. As the MWNT concentration is increased to 40 wt. % (FIGS. 8(e) and (f), Sample A4), the network may become thicker, and there may be a dramatic increase in porosity. Without limitation, this porosity may be the result of the polymer's inability to envelop the stabilized MWNT, which may create microvoids that act as a barrier for complete polymer coalescence.

FIGS. 9(a)-(d) show SEM cross-sectional images of the DWNT:(PEDOT:PSS):TCPP system with varying DWNT concentrations. FIG. 9(a) was a 10 wt. % DWNT composite (Sample F1), shown at higher magnification in FIG. 9(b). The nanotube network appeared more uniform and detached from the matrix than that observed for MWNT. The DWNTs were extracted from the composite rather than fractured or embedded in the matrix, which was due to their high mechanical strength. The porosity seemed to be slightly decreased when compared to the MWNT-filled composites (FIG. 8), which was due to the composites being heated at a temperature above the latex's Tg that allowed for increased coalescence. As the DWNT concentration was increased to 40 wt. % (Sample F4) (FIG. 9(b)), the porosity was dramatically increased and became a factor in the degradation of mechanical properties, which was linked to the critical pigment volume concentration (CPVC) phenomenon commonly seen in these polymer nanocomposites. CPVC describes the maximum amount of filler that may be added to the matrix and still maintain sufficient wetting of the filler by the polymer. Above the CPVC, the mechanical properties may deteriorate to such a degree that it may affect the transport properties.

Figures 10A, 10B:
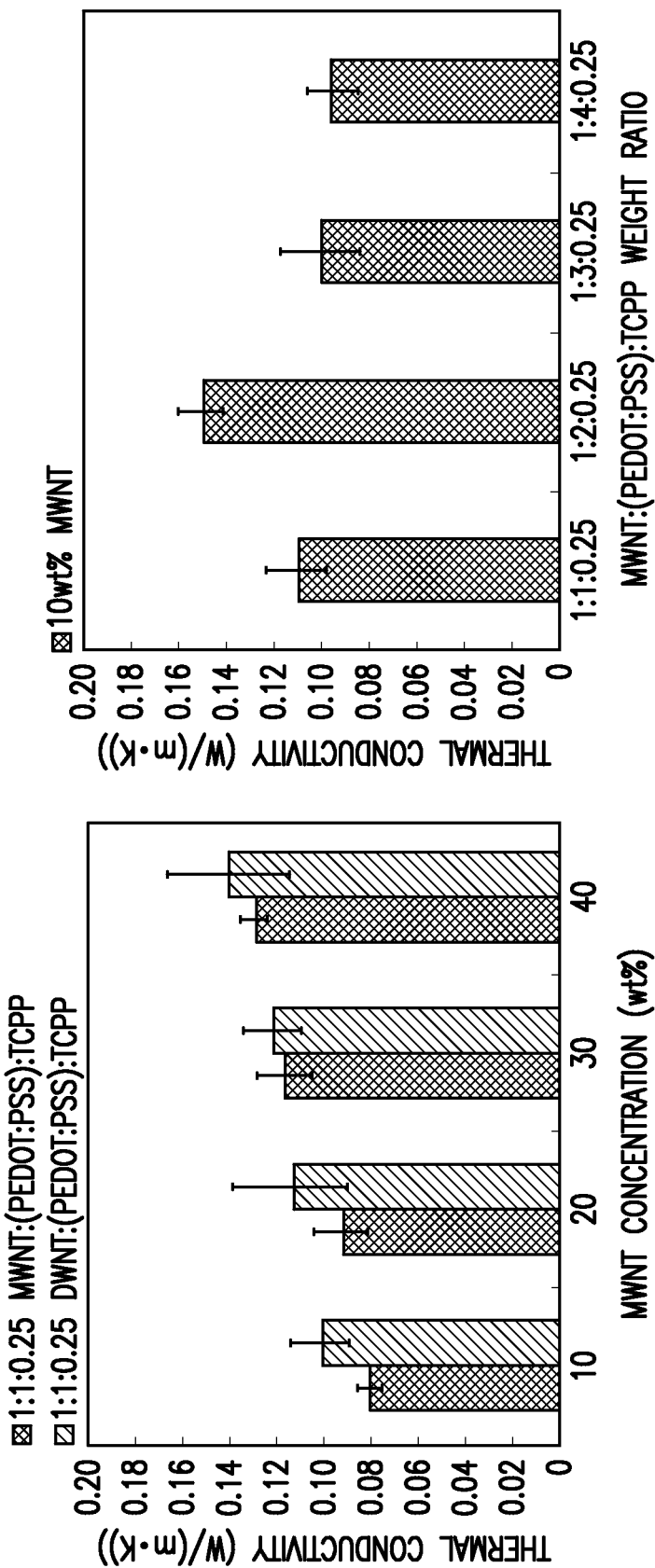
FIG. 10(a) illustrates through-thickness thermal conductivity values of 1:1:0.25 CNT:(PEDOT:PSS):TCPP as a function of CNT concentration.
FIG. 10(b) illustrates a 10 wt. % MWNT as a function of MWNT:(PEDOT:PSS):TCPP weight ratio.

FIGS. 10(a)-(b) show the through-thickness thermal conductivities of these segregated network polymer composites. FIG. 10(a) illustrates 1:1:0.25 CNT:(PEDOT:PSS):TCPP weight ratio composites as the CNT concentration was increased (samples A1-A4 and F1-F4). Unlike electrical conductivity, the thermal conductivity was shown to be relatively insensitive to CNT and stabilizer concentration. Thermal conductivities of MWNT-filled composites increased from 0.08 to 0.12 W/(m·K) as the concentration increased from 10 to 40 wt. %, respectively. When MWNT was replaced by DWNT, the thermal conductivity did not show a dramatic increase (0.10-0.14 W/(m·K)). Thermal conductivity of the matrix (~0.2 (W/(m·K))) was orders of magnitude lower than that of carbon nanotubes (~1,000 (W/(m·K))). The increasing addition of such a thermally conductive filler would be expected to result in a large increase in overall composite thermal conductivity. Theoretically, at 40 wt. % CNT, the theinial conductivity for the composite may be as large as ~400 W/(m·K). However, the theoretical value of a single CNT was much higher than the bulk experimental value, which took into account the numerous high thermal contact resistances between the tubes themselves (~1,000 to ~15 W/(m·K), respectively). If this bulk experimental value was chosen instead of the theoretical, the thermal conductivity would be ~6 W/(m·K).

It should also be noted that the thermal conductivity was not affected by the amount of PEDOT:PSS used to stabilize the MWNT (FIG. 10(b)). These composites (Samples A1, B1, C1, and D1), range in thermal conductivity from 0.09-0.12 W/(m·K) with no discernible trend. These low experimental values (~0.12 W/(m·K) for the 40 wt. % MWNT composite) may also be attributed to the numerous high thermal contact resistances occurring between the nanotubes, PEDOT:PSS, TCPP, and latex particles (known as the Kapitza resistance). This low k may be credited to the increased porosity, accompanied by the high concentration of CNTs, which further disrupted phonon transport through the composite. These organic stabilizers may also act as phonon scattering centers because they are embedded in the composite alongside the MWNT.

Figure 11A:
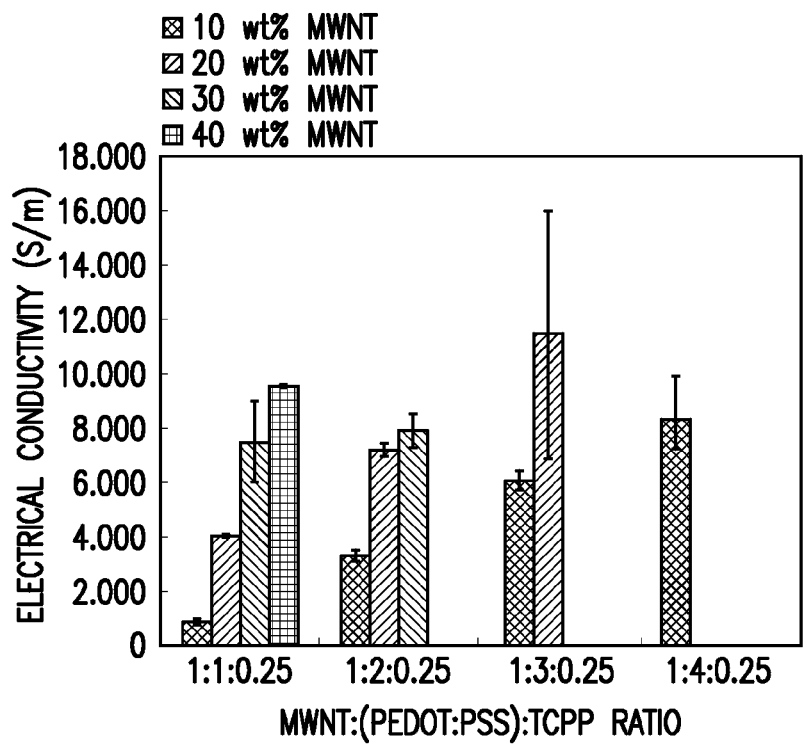
FIG. 11(a) illustrates in-plane electrical conductivity values as a function of both MWNT concentration and MWNT:(PEDOT:PSS):TCPP weight ratio.

FIG. 11(a) shows the in-plane electrical conductivity of these composites as a function of MWNT:(PEDOT:PSS):TCPP ratio and MWNT concentration. As the MWNT concentration was increased for each MWNT:(PEDOT:PSS):TCPP ratio, the electrical conductivity also increased. A composite containing 1:1:0.25 MWNT:(PEDOT:PSS):TCPP and 40 wt. % MWNT (Sample A4) reached an electrical conductivity of ~9,500 S/m, which was comparable to that of a composite with 10 wt. % MWNT and 1:4:0.25 MWNT:(PEDOT:PSS):TCPP (Sample D1, ~8,500 S/m). It is important to note that electrical conductivities of 0.1-1000 S/m are typically observed in traditional nanotube-filled polymer composites with similar concentrations. PEDOT:PSS was believed to create less electrically resistive junctions between tubes, so increasing the amount of PEDOT:PSS within the composite may help stabilize more MWNT and create a large number of electrically-bridged junctions. This behavior enabled higher conductivity to be reached without having to add additional filler.

Figure 11B:
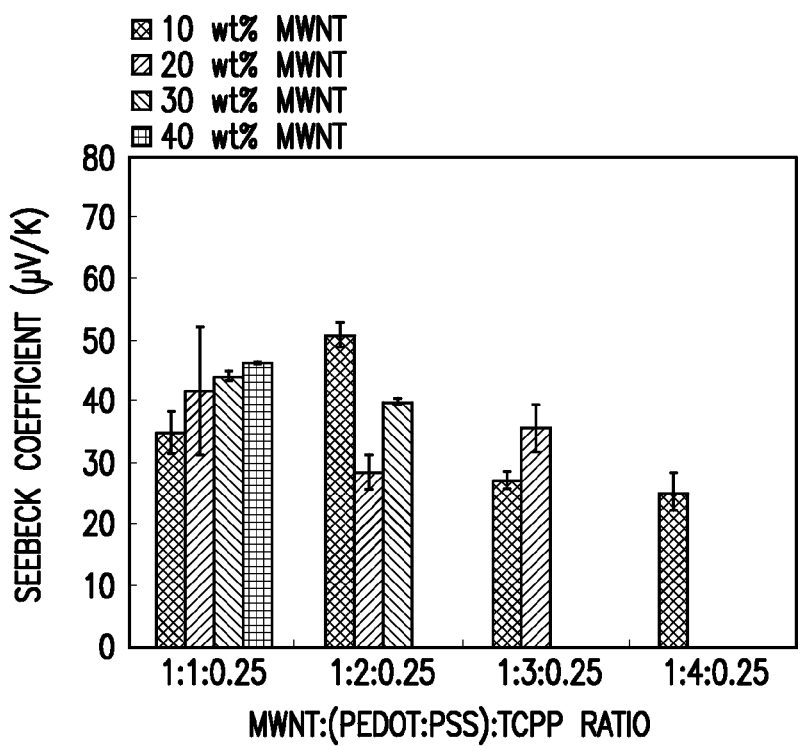
FIG. 11(b) illustrates Seebeck coefficients as a function of both MWNT concentration and MWNT:(PEDOT:PSS):TCPP weight ratio.

Increasing the MWNT concentration and altering the MWNT:(PEDOT:PSS):TCPP ratio did not have a dramatic effect on the Seebeck coefficient, which ranged from ~25-50 µV/K (FIG. 11(b)). Without limitation, the consistency in the Seebeck coefficient is believed to be caused by a small energy barrier hindering low energy electron transport at the tube junctions, which may leave it insensitive to changes in electrical conductivity. The Seebeck coefficients appeared to decrease slightly as the concentration of PEDOT:PSS was increased, which may be due to its intrinsically small S (~20 µV/K). The Seebeck coefficients reported here were greater than MWNT:TCPP composites (~28 µV/K), and similar to values reported for SWNT:(PEDOT:PSS) composites (40-60 µ/K). As the dual stabilizers created a larger barrier for low energy electron transport, these composites maintained the high electrical conductivity of PEDOT:PSS stabilized composites. This was a strong indication that the thermoelectric properties of these polymer composites may be manipulated by tailoring the junctions between nanotubes with different combinations of stabilizing agents.

Figure 12A:
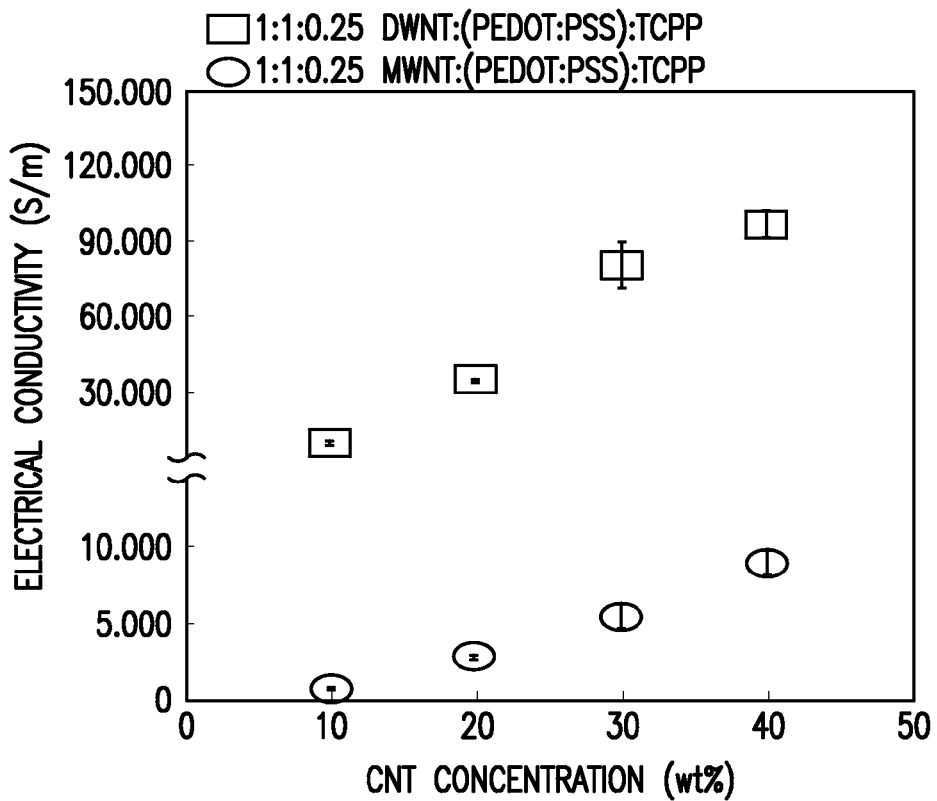
FIG. 12(a) illustrates in-plane electrical conductivity as a function of CNT concentration and type.
Figure 12B:
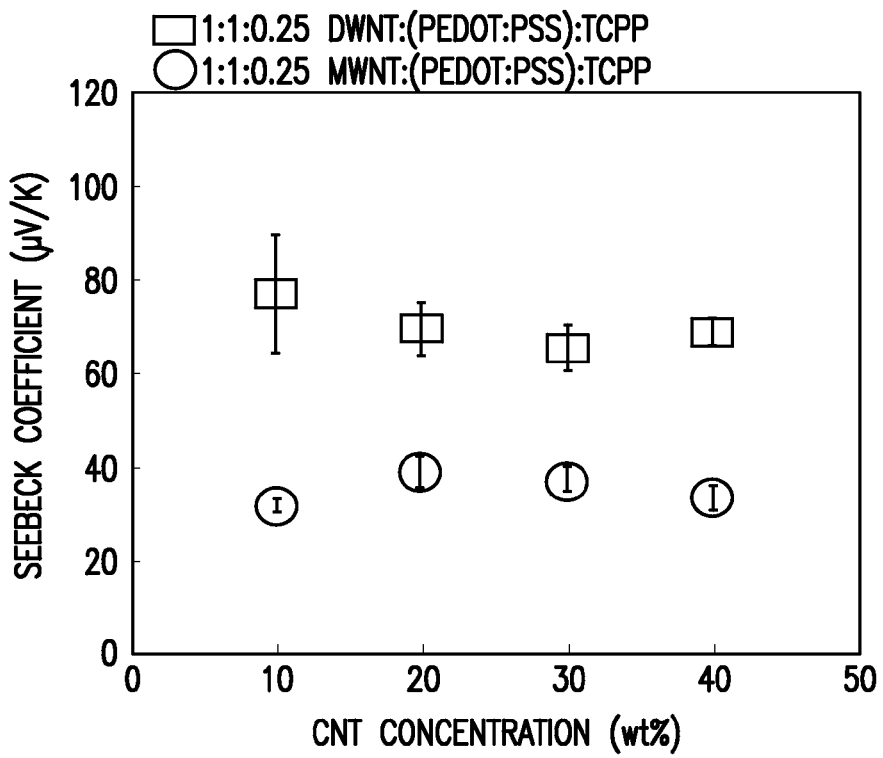
FIG. 12(b) illustrates Seebeck coefficients as a function of CNT concentration and type.
Figure 13A:
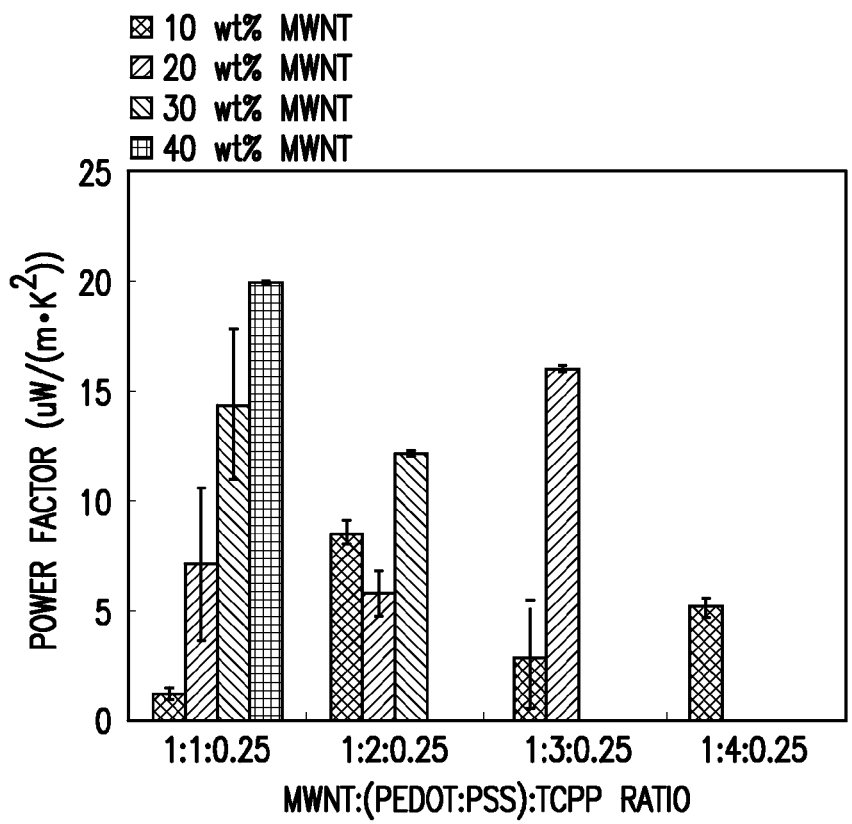
FIG. 13(a) illustrates composite power factor measured as a function of both MWNT concentration and type.
Figure 13B:
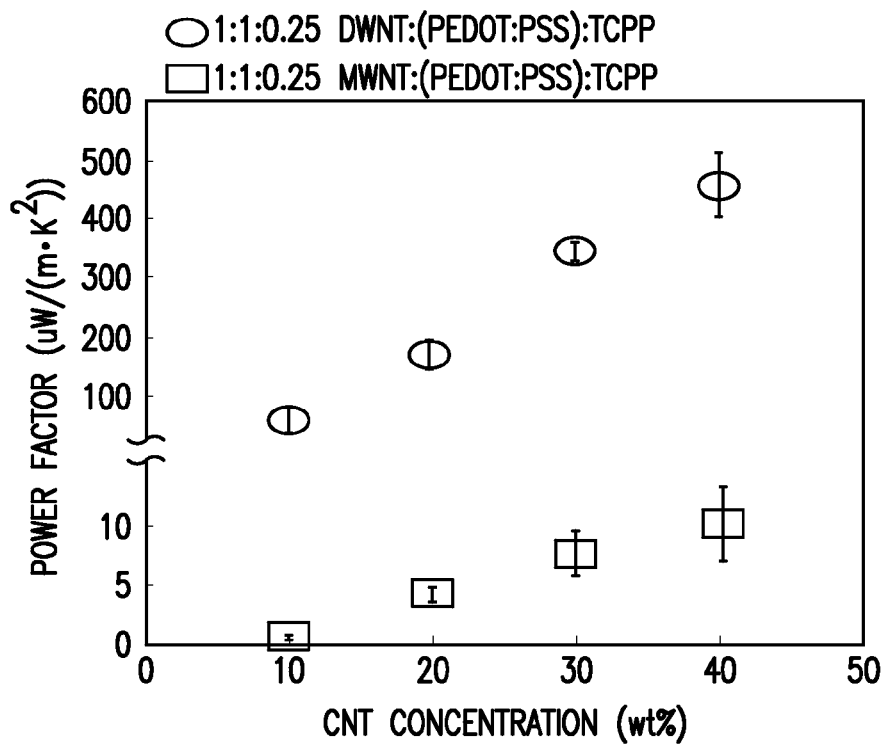
FIG. 13(b) illustrates composite power factor measured as a function of both NCT concentration and type.

In an effort to further enhance electrical conductivity; two sets of composites were placed in an oven for 6 hours at 80° C. (FIG. 12(a), Samples E-F). The elevated temperature softened the polymer particles (Tg=-15° C.), allowing them to better tighten the electrically conductive network that exists between the nanoparticles. Comparing MWNT to DWNT-filled composites, the electrical conductivities increased roughly an order of magnitude at each CNT concentration. At 40 wt. % CNT, the electrical conductivity reached ~96,000 and ~9,500 S/m for DWNT-filled and MWNT-filled composites, respectively. This conductivity for DWNT-filled composites was comparable to the highest values reported for completely organic, free-standing composites and may be attributed to the high intrinsic conductivity of this type of CNT. Without limitation, the increased electrical conductivity may be explained by the DWNT having a higher structural stability, creating highly conductive π-conjugated pathways that remained undisturbed on the inner tube during functionalization and allowed each tube to act as independent single-walled carbon nanotubes (SWNT). Without limitation, the large conductivity in DWNT filled composites may also be explained by the tube lengths appearing longer compared to the MWNT, as evidenced in the SEM images (FIGS. 8(a)-(f) and 9(a)-(d), respectively). The MWNTs may have been mechanically degraded (i.e., scission of the tubes) during sonication, reducing their lengths. The longer tube lengths may reduce the frequency of CNT-CNT junctions, which dominate the resistivity, throughout a conductive network. As one of the DWNT tubes was always metallic in character, the other semiconducting tube may help to enhance the Seebeck coefficient (FIG. 12(b)), which remained insensitive to CNT concentration and was not directly affected by the increased drying temperature. MWNT-filled composites maintained values of ~40 µV/K, which were similar to those reported previously (FIG. 11(b)). As MWNT was compared to DWNT-filled composites, the Seebeck coefficients increased more than 50% (~40 to 70 µV/K) when replacing MWNT with DWNT. This large increase was previously seen with DWNT-filled composites and was directly related to the intrinsic properties of this nanotube type. The ability to maintain similar electrical conductivities, while increasing Seebeck coefficient, resulted in power factors (PF=S2σ) comparable to the largest reported for a fully organic material. FIG. 13(a) showed PF as a function of MWNT concentration and MWNT:(PEDOT:PSS):TCPP ratio. With a 1:1:0.25 MWNT:(PEDOT:PSS):TCPP ratio, the power factor increased linearly as the MWNT concentration was increased from 10 to 40 wt. % (1.24 to 20.2 µW/(m·K2), respectively). This behavior trended with the increasing electrical conductivity and relatively constant Seebeck coefficient (FIGS. 11(a)-(b)). Increasing PEDOT:PSS, while holding the other components constant, produced no discernible trend due to the small variations in S (FIG. 11(b)). Replacing MWNT with DWNT (FIG. 13(b), Samples F1-F4), resulted in a 25× improvement in PF. The 40 wt % DWNT 1:1:0.25 DWNT:(PEDOT:PSS):TCPP composite achieved a power factor of ~500 µW/(m·K2) at room temperature. This was among the highest values ever reported for a fully organic freestanding composite, and was within a factor of five of traditional single crystal inorganic thermoelectric materials (≥2,500 µW/(m·K2)). This level of performance made these flexible, organic materials viable for practical applications.

The results illustrate the influence of CNT type and concentration, PEDOT:PSS concentration, and drying condition on thermoelectric properties. The stabilization by PEDOT:PSS and TCPP, presumably by π-π stacking, bridges nanotubes and helped charge carriers (i.e., holes) to travel more efficiently in these composites, resulting in high electrical conductivity. Thermal conductivity (0.09-0.14 W/(m·K)) was relatively unaffected by stabilizer concentration (1:1:0.25 to 1:4:0.25 MWNT:(PEDOT:PSS):TCPP), CNT concentration (10 to 40 wt %), and CNT type. This was due to the mismatches in vibrational spectra at the many interfaces between composite constituents that impede phonon transport. At 40 wt. % MWNT, the 1:1:0.25 MWNT:(PEDOT:PSS):TCPP composite exhibited an electrical conductivity of ~9,500 S/m and the Seebeck coefficient remained relatively insensitive to MWNT concentration and MWNT:(PEDOT:PSS):TCPP weight ratio (~40 µV/K). Using DWNT at 40 wt. % in a 1:1:0.25 DWNT:(PEDOT:PSS):TCPP composite, produced electrical conductivity of ~96,000 S/m and nearly doubled the Seebeck coefficient (~70 µV/K) of the comparable MWNT composite. These thermoelectric properties were much greater than those of typical polymer composites containing CNT, yielding a power factor (S2σ) that is among the highest ever reported for a completely organic, flexible material (~500 µW/(m·K2)). These composites have the potential to eventually exceed commonly used inorganic semiconductors in thermoelectric efficiency (and already do when normalized by density).

Example 2

P-type CNT films were made of as-purchased CNTs by filtering aqueous solutions containing CNTs dispersed by SDBS. It is to be understood that when the CNTs are exposed to air, they become P-type due to oxygen doping without any additional chemical treatments. In this example, we used CNTs synthesized by a chemical vapor deposition (CVD) method to obtain a relatively high thermopower.

The thermoelectric properties of a CNT film may be strongly affected by the degree of dispersion and the type of dispersants as well as junctions between CNTs. We thickened the SDBS junction between CNTs using a 3:1 weight ratio of SDBS to CNT, so as to raise thermopower up to 97 µV/K (with $1.1 \times 10^4$ S/m).

Air-exposed CNTs were reduced by using PEI and DETA with subsequent $NaBH_4$ treatment in order to make N-type films. When PEI coats CNTs, P-type CNTs were effectively converted to N-type CNTs. However, PEI is electrically insulating and thereby may deter electronic transport at the junction between CNTs. This may be related to a large molecular weight (i.e., long chain) of PEI, increasing the thickness of electrically insulating coating layers. In order to alleviate this problem, DETA, a short molecule with similar to the structure of PEI, was introduced. The nitrogen in DETA may play a role in N-type doping like PEI.

The weight ratio of PEI to DETA was varied in order to find a ratio maximizing the power factor ($S^2\sigma$, where S and a stand for thermopower and electrical conductivity, respectively). When 33 wt. % PEI was replaced by DETA, the electrical conductivity was improved to 3,900 S/m from 3,100 S/m of a 100-wt % PEI sample. At the same time, thermopower was also improved to ~63 µV/K. Nevertheless, with larger amounts (50 and 67 wt. %) of DETA, the absolute value of thermopower was decreased with electrical conductivity reductions. With only DETA as a doping agent, the typical thermopower value of CNT films (~40 µV/K) was diminished to 8.4 µV/K, but thermopower values were still positive. The sample doped by 67/33-wt % PEI/DETA was additionally reduced by $NaBH_4$, and the electrical conductivity and thermopower were further improved to 5,200 S/m and −86 µV/K, respectively. This resulted in an increase of the power factor to 38 µW/m-$K^2$, compared to that of the sample doped by only PEI.

It is to be understood that the thermopower may contain two contributions from holes and electrons with opposite signs. When two different types of carriers are present, thermopower may be described as:

$$S = (S_e \sigma_e + S_h \sigma_h)/\sigma \quad \text{(Eq. 2)}$$

where $S_e$ and $S_h$ stand for thermopower due to electrons and holes, respectively; $\sigma_e$ and $\sigma_h$ stand for electrical conductivity due to electrons and holes, respectively; $\sigma$ is the electrical conductivity due to both electron and hole carriers. When the contribution from electrons becomes dominant, the first term in Eq. (2) plays a major role, resulting in negative thermopower values. On the other hand, when the contributions from electrons and holes are comparable, thermopower becomes small due to the negative $S_e$ and positive $S_h$. The increase of both electrical conductivity and thermopower is likely to be caused by the van Hove singularity in CNTs. When the Fermi level is raised towards the band edge, thermopower becomes larger due to the asymmetry in the differential electrical conductivity of CNTs.

The presence of PEI in the samples was confirmed by scanning electron micrographs (SEMs) and Fourier transform infrared (FTIR) spectra. The tubular structures with relatively small diameters in the P-type CNT sample were clearly observed as opposed to the N-type CNTs whose diameters are relative large due to PEI and DETA coating layers. The N-type CNTs were well embedded in the film, which indicated PEI/DETA coated most of the exposed CNT surfaces with relatively thick coating layers. If the coating was not uniform, some of the CNTs may have been pulled out from the surface.

Figure 5B:
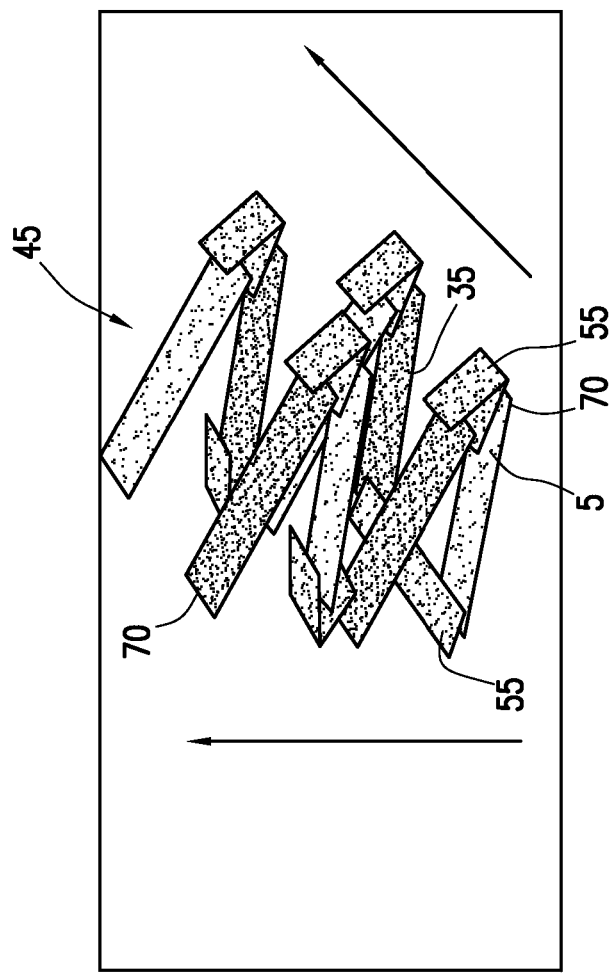
FIGS. 5(a), (b) illustrate an embodiment of a method for assembling a thermoelectric module having stacked N-type and P-type carbon nanotubes.
Figure 5A:
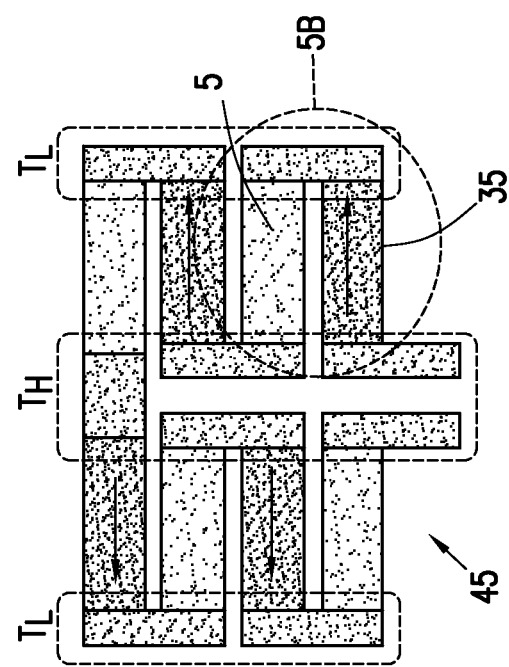

The P- and N-type films were cut into 25 mm×4.0 mm (i.e. legs), and they were alternatively connected electrically in series and thermally in parallel with electrically insulating PTFE films between the legs, as schematically depicted in FIG. 3. An as-assembled stack of legs is shown in FIGS. 5(a) and 5(b). Each thermoelectric module was connected in series by copper foils. The thermoelectric device architecture is designed to maximize thermoelectric voltage determined by thermopower ($S_{p\ or\ n}$) and temperature gradient between hot and cold sides ($\Delta T_{i\ or\ j}$) as well as the number of legs. The total thermoelectric voltage ($V_{TE}$) generated from the device can be described as:

$$|V_{TE}| = N_m \left[ \sum_{i=1,3,5,\ldots}^{N_l-1} |S_p \Delta T_i| + \sum_{j=2,4,6,\ldots}^{N_l} |S_n \Delta T_j| \right] \quad \text{(Eq. 3)}$$

where $N_m$ and $N_l$ respectively indicate the numbers of thermoelectric modules and legs in each device; the subscripts, p and n indicate P- and N-type; $\Delta T_i$ and $\Delta T_j$ stand for the temperature gradient along the long edge of a leg indexed from the bottom to the top.

The center part of the device was mounted on a heating block, where top and bottom aluminum blocks were heated to create temperature gradients. The output thermoelectric (open-circuit) voltage was measured to be ~9.3 mV per K, leading to 465 mV at $\Delta T$=49 K. Load resistances were varied to record current as a function of the output voltage, and then the output power was plotted. The advantage of the stacking method was to increase the voltage generated by each leg. For this example, the modules were clamped with a moderate pressure (approximately 700 N/$m^2$) in order to simulate normal operation in practice.

In order to estimate the temperature drop across each leg, the temperature of the top surface of a module was measured while the bottom part of the module was heated to 35, 45, and 55° C. Assuming that there was a linear temperature drop along the thickness direction of the module at the heating side, the temperatures at the middle of the stack in the heating side were estimated to be 31.6, 38.5, and 45.8° C., respectively. From the measurement data, $\Delta T_{drop}$ by each layer was estimated to be 4% of total temperature drop. The actual temperature ($T_{i,hot}$) on the hot side of $i^{th}$ leg from the bottom of each module may be calculated as $T_{i,hot}$−0.04×i× $\Delta T$. By considering the temperature drop in the modules, theoretical $V_{TE}$ as a function of $\Delta T$ was obtained.

The temperature drop comes from the thermal resistance ($R_{thermal}$) of the module along the thickness direction, which may be estimated by using a series resistor model.

$$R_{thermal} = \sum_{i=1}^{N_l} \frac{1}{A} \left( \frac{t_{PTFE}}{k_{PTFE}} + \frac{t_{Al}}{k_{Al}} + \frac{t_{CNT}}{k_{CNT}} + R_{contact} \right)_i \quad \text{(Eq. 4)}$$

where A, t, and k indicate the thickness, thermal conductivity, and area of the indexed materials, respectively; $R_{contact}$ is thermal contact resistance between the films. In the bracket of Eq. (4), the thermal contact resistance mainly due to air trapped between the layers. Among the first three terms, thermal resistance from PTFE is dominant due to relatively thick layer (~220 µm), compared to Al (~20 µm) and CNT (8 µm). Assuming thermal conductivity of PTFE was ~0.25 W/m-K, the first term in the bracket of Eq. (4) was estimated to be $\sim 9 \times 10^{-4}$ $m^2$K/W, which was comparable to typical thermal contact resistances between metallic interfaces under vacuum (i.e., poor thermal contact). This suggested that further optimized devices may yield a higher output voltage.

These results indicated that the electronic transport properties may be controlled by adjusting the amount of coating on CNTs for P-type films as well as reducing CNTs with multiple agents, PEI, DETA, and $NaBH_4$ for N-type. By optimizing the mixing ratio of PEI to DETA (67:33 wt. %), N-type thermopower values as large as −86 µV/K at 5,200 S/m were obtained due to synergistic effects from both large and small dopant molecules. According to Kelvin probe measurement results, the Fermi level of the p-type samples (−4.91 eV) were changed to −4.69 eV after PEI/DETA reduction and −4.61 eV after additional $NaBH_4$ reduction, clearly indicating N-type conversion after the doping processes.

The thermoelectric device was made of 72 P-type and 72 N-type CNT films electrically connected in series and thermally in parallel so as to maximally utilize temperature gradients. This device produced 465 mV at a temperature gradient of 49 K, which was much larger than those of other polymer based composites.

It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present embodiments are well adapted to attain the ends and advantages mentioned as well as those that are inherent therein. The particular embodiments disclosed above are illustrative only, as the present embodiments may be modified and practiced in different but equivalent manners apparent to those skilled in the art having the benefit of the teachings herein. Although individual embodiments are discussed, all combinations of each embodiment are contemplated and covered by the disclosure. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative embodiments disclosed above may be altered or modified and all such variations are considered within the scope and spirit of the present disclosure. If there is any conflict in the usages of a word or term in this specification and one or more patent(s) or other documents that may be incorporated herein by reference, the definitions that are consistent with this specification should be adopted.

What is claimed is:

1. A thermoelectric module, comprising:
   an adhesive;
   an N-type carbon nanotube film, wherein the N-type carbon nanotube film is fabricated by functionalizing a carbon nanotube with diethylenetriamine and polyethyleneimine, wherein the functionalizing comprises a synergistic effect from diethylenetriamine molecules and polyethyleneimine molecules; and reducing the N-type carbon nanotube film with $NaBH_4$;
   a P-type carbon nanotube film;
   wherein at least one of the N-type carbon nanotube film or the P-type carbon nanotube film comprise poly(3,4-ethylene-dioxythiophene)poly(styrenesulfonate) and meso-tetra(4-carboxyphenyl) porphine and is.

2. The thermoelectric module of claim 1, further comprising precipitating copper nanoparticles to decorate nanoparticles on the P-type carbon nanotube film, wherein the P-type carbon nanotube film is synthesized by exposure to a $CuSO_4$ solution.

3. The thermoelectric module of claim 1, further comprising electrical insulation.

4. The thermoelectric module of claim 3, wherein the electrical insulation is arranged between each connected P-type carbon nanotube film and N-type carbon nanotube film.

5. The thermoelectric module of claim 3, wherein the electrical insulation comprises polytetrafluoroethylene film.

6. The thermoelectric module of claim 1, wherein the adhesive secures the N-type carbon nanotube film and the P-type carbon nanotube film to each other.

7. The thermoelectric module of claim 1, wherein the adhesive comprises silver and a carbon-based filler.

8. The thermoelectric module of claim 7, wherein the silver comprises silver paste.

9. The thermoelectric module of claim 7, wherein the carbon-based filler comprises carbon black, graphite, carbon nanotubes, graphene, or any combinations thereof.

10. The thermoelectric module of claim 1, comprising one hundred of the N-type carbon nanotube films and one hundred of the P-type carbon nanotube films.

11. The thermoelectric module of claim 1, comprising a plurality of the N-type carbon nanotube films a plurality of the P-type carbon nanotube films, wherein the N-type carbon nanotube films and P-type carbon nanotube films are in parallel and series.

12. The thermoelectric module of claim 1, wherein at least one of the N-type carbon nanotube film or the P-type carbon nanotube film comprises double-walled carbon nanotubes, and in the at least one of the N-type carbon nanotube film or the P-type carbon nanotube film, the ratio of the double-walled carbon nanotubes to the poly(3,4-ethylene-dioxythiophene)poly(styrenesulfonate) and to the meso-tetra(4-carboxyphenyl) porphine is 1:1:0.25.

* * * * *